(12) United States Patent
Ogashiwa et al.

(10) Patent No.: US 9,040,911 B2
(45) Date of Patent: May 26, 2015

(54) SCANNING ELECTRON MICROSCOPE

(71) Applicant: Hitachi High-Technologies Corporation, Minato-ku, Tokyo (JP)

(72) Inventors: Takeshi Ogashiwa, Tokyo (JP); Mitsugu Sato, Tokyo (JP); Mitsuru Konno, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/397,079

(22) PCT Filed: Mar. 25, 2013

(86) PCT No.: PCT/JP2013/058482
§ 371 (c)(1),
(2) Date: Oct. 24, 2014

(87) PCT Pub. No.: WO2013/161473
PCT Pub. Date: Oct. 31, 2013

(65) Prior Publication Data
US 2015/0108351 A1    Apr. 23, 2015

(30) Foreign Application Priority Data
Apr. 27, 2012  (JP) .................................. 2012-102000

(51) Int. Cl.
*H01J 37/26* (2006.01)
*H01J 37/28* (2006.01)
(Continued)

(52) U.S. Cl.
CPC ............... *H01J 37/222* (2013.01); *H01J 37/28* (2013.01); *H01J 37/21* (2013.01);
(Continued)

(58) Field of Classification Search
USPC ....... 250/307, 309–311, 396 R, 396 ML, 397
See application file for complete search history.

(56) References Cited

U.S. PATENT DOCUMENTS 5,563,415 A * 10/1996 Crewe .................... 250/396 ML
6,051,839 A *  4/2000 Crewe .................... 250/396 ML
(Continued)

FOREIGN PATENT DOCUMENTS

JP        56-116260 A    9/1981
JP         61-19046 A    1/1986
(Continued)

OTHER PUBLICATIONS

International Search Report dated Jul. 2, 2013 with English translation (seven pages).

*Primary Examiner* — Bernard E Souw
(74) *Attorney, Agent, or Firm* — Crowell & Moring LLP

(57) ABSTRACT

Conventionally, in a general-purpose scanning electron microscope, the maximum accelerating voltage which can be set is low, and hence thin crystal samples which can be observed under normal high-resolution observation conditions are limited to samples with large lattice spacing. For this reason, there has no means for accurately performing magnification calibration. As means for solving this problem, the present invention includes an electron source which generates an electron beam, a deflector which deflects the electron beam so as to scan a sample with the electron beam, an objective lens which focuses the electron beam on the sample, a detector which detects an elastically scattered electron and an inelastically scattered electron which are transmitted through the sample, and an aperture disposed between the sample and the detector to control detection angles of the elastically scattered electron and the inelastically scattered electron. The electron beam enters the sample at a predetermined convergence semi-angle, and a lattice image is acquired at a second convergence semi-angle larger than a first convergence semi-angle at which a beam diameter is minimized on the sample.

8 Claims, 10 Drawing Sheets

(51) Int. Cl.
*G01N 23/225* (2006.01)
*H01J 37/22* (2006.01)
*H01J 37/21* (2006.01)

(52) U.S. Cl.
CPC . *H01J 2237/2802* (2013.01); *H01J 2237/2804* (2013.01); *H01J 2237/24475* (2013.01); *H01J 2237/24507* (2013.01); *H01J 2237/10* (2013.01)

(56) References Cited

U.S. PATENT DOCUMENTS

| | | |
|---|---|---|
| 7,375,330 B2 | 5/2008 | Inada et al. |
| 2011/0139980 A1* | 6/2011 | Nakano et al. ............... 250/307 |
| 2012/0217152 A1* | 8/2012 | Miller ...................... 204/192.34 |
| 2013/0112875 A1* | 5/2013 | Nakamura et al. ........... 250/311 |

FOREIGN PATENT DOCUMENTS

| | | |
|---|---|---|
| JP | 6-36729 A | 2/1994 |
| JP | 2001-27619 A | 1/2001 |
| JP | 2007-109509 A | 4/2007 |
| JP | 4464857 B2 | 2/2010 |

* cited by examiner (a)

(b)

(a)

(b)

ON SIGNAL DETECTION SURFACE 64

(a)

(b)

(a)

(b)

ON SIGNAL DETECTION SURFACE 64

(a)

(b)

SCANNING ELECTRON MICROSCOPE

TECHNICAL FIELD

The present invention relates to a scanning electron microscope. More particularly, it relates to a scanning electron microscope having means for detecting a scanning transmission electron and a scanning transmission electron microscope.

BACKGROUND ART

A scanning electron microscope is an instrument which focuses a primary electron beam emitted from an electron gun on a sample through a magnetic field lens, scans the sample with the primary electron beam through a magnetic field deflector or an electric field deflector, and detects secondary charged particles (for example, secondary electrons or scanning transmission electrons) from the sample, thereby obtaining an enlarged image of the sample. The observation magnification of the enlarged image of the sample is defined by the ratio between the scanning width of the primary electron beam on the sample surface and the display width of the enlarged image formed by the secondary charged particles obtained from the scanned area. The scanning width of the primary electron beam on the sample can be arbitrarily changed by the deflector. Therefore, if the display width of the enlarged image is constant, the observation magnification decreases by widening the scanning area of the primary electron beam on the sample, and the observation magnification increases by narrowing the scanning area. Hereinafter, for the sake of simplicity, the following description will be made on the assumption that the magnification value in this specification is defined with the display width of the enlarged image of 100 mm which is close to the generally used value. In this case, a magnification of 10,000× indicates a state in which a sample image of a 10-µm region is displayed on an enlarged image with a width of 100 mm.

Recently, samples to be observed with a scanning electron microscope have been so miniaturized, and the observation at a magnification of 1,000,000× or more (display region of sample: 100 nm or less), which has hardly been practiced, has been required. In addition, in order to measure the dimensions of a sample structure, highly accurate and reliable dimensional calibration (magnification calibration) is required in this magnification range. The dimensional calibration requires accurate dimensional measurement at a magnification higher than that at the observation.

Conventionally, in the execution of the accurate dimensional calibration, by the use of a microscale having known dimensions, the dimensions of several pitches thereof are measured, and the resultant value is used as a true value. In addition, when a secondary charged particle is a scanning transmission electron, as disclosed in the Patent Document 1, a lattice image is obtained by using a thin single crystal sample having a known crystalline structure (lattice spacing), and dimensional calibration is performed by using the image.

RELATED ART DOCUMENTS

Patent Documents

Patent Document 1: Japanese Patent No. 4464857 (U.S. Pat. No. 7,375,330)

SUMMARY OF THE INVENTION

Problems to be Solved by the Invention

When performing the dimensional calibration of a scanning electron microscope by using a microscale having known dimensions, since the minimum value of one pitch of the microscale is about 100 nm and satisfactory measurement accuracy cannot be obtained unless a plurality of dimensions are measured a plurality of times, the microscale does not have a sufficient dimensional pitch with respect to a sample image with a magnification of 1,000,000× or more, and hence cannot be applied to the dimensional calibration. In addition, the process to reduce the dimensional pitch of a microscale is difficult, and as the dimensional pitch decreases, the reliability of calibration decreases.

When performing the dimensional calibration by using a thin single crystal sample having a known crystalline structure according to the Patent Document 1, since a transmission electron microscope or scanning transmission electron microscope with an accelerating voltage of 100 kV or more can acquire a high-resolution scanning transmission image and crystalline lattice image (hereinafter, referred to as lattice image) under normal high-resolution observation conditions, it is possible to observe a crystalline structure as long as normal high-resolution observation conditions are set. However, in a scanning transmission image observation using a general commercial scanning electron microscope, the maximum accelerating voltage which can be set is as low as 30 kV, and hence the resolution is low in comparison with that in a transmission electron microscope or the like with an accelerating voltage of 100 kV or more. Therefore, thin crystal samples which can be observed under normal high-resolution observation conditions are limited to samples with large lattice spacing d (for example, d=approx. 1.0 nm). For this reason, there is not much merit in using the above technique in actual applications, and the observation using it has not been attempted.

An object of the present invention is to provide a scanning electron microscope capable of acquiring a scanning transmission image of a lattice image having a known crystalline structure and performing high-accuracy dimensional calibration (magnification calibration) by using the acquired image even in a general-purpose scanning electron microscope.

Means for Solving the Problems

In order to solve the problem mentioned above, a scanning transmission electron microscope of the present invention includes: an electron source which generates an electron beam; a deflector which deflects the electron beam so as to scan a sample with the electron beam; an objective lens which focuses the electron beam on the sample; a detector which detects a scanning transmission electron transmitted through the sample; and an aperture which is disposed between the sample and the detector to control a detection angle of the scanning transmission electron, the electron beam enters the sample at a predetermined convergence semi-angle, and a lattice image is acquired at a second convergence semi-angle larger than a first convergence semi-angle at which a beam diameter is minimized on the sample.

Effects of the Invention

According to the present invention, it is possible to provide a scanning electron microscope capable of acquiring a scanning transmission image of a lattice image having a known crystalline structure and performing high-accuracy dimensional calibration (magnification calibration) by using the acquired image even in a general-purpose scanning electron microscope.

BRIEF DESCRIPTIONS OF THE DRAWINGS

DESCRIPTION OF EMBODIMENTS

Hereinafter, an embodiment of the present invention will be described in detail with reference to the accompanying drawings.

Figure 1:
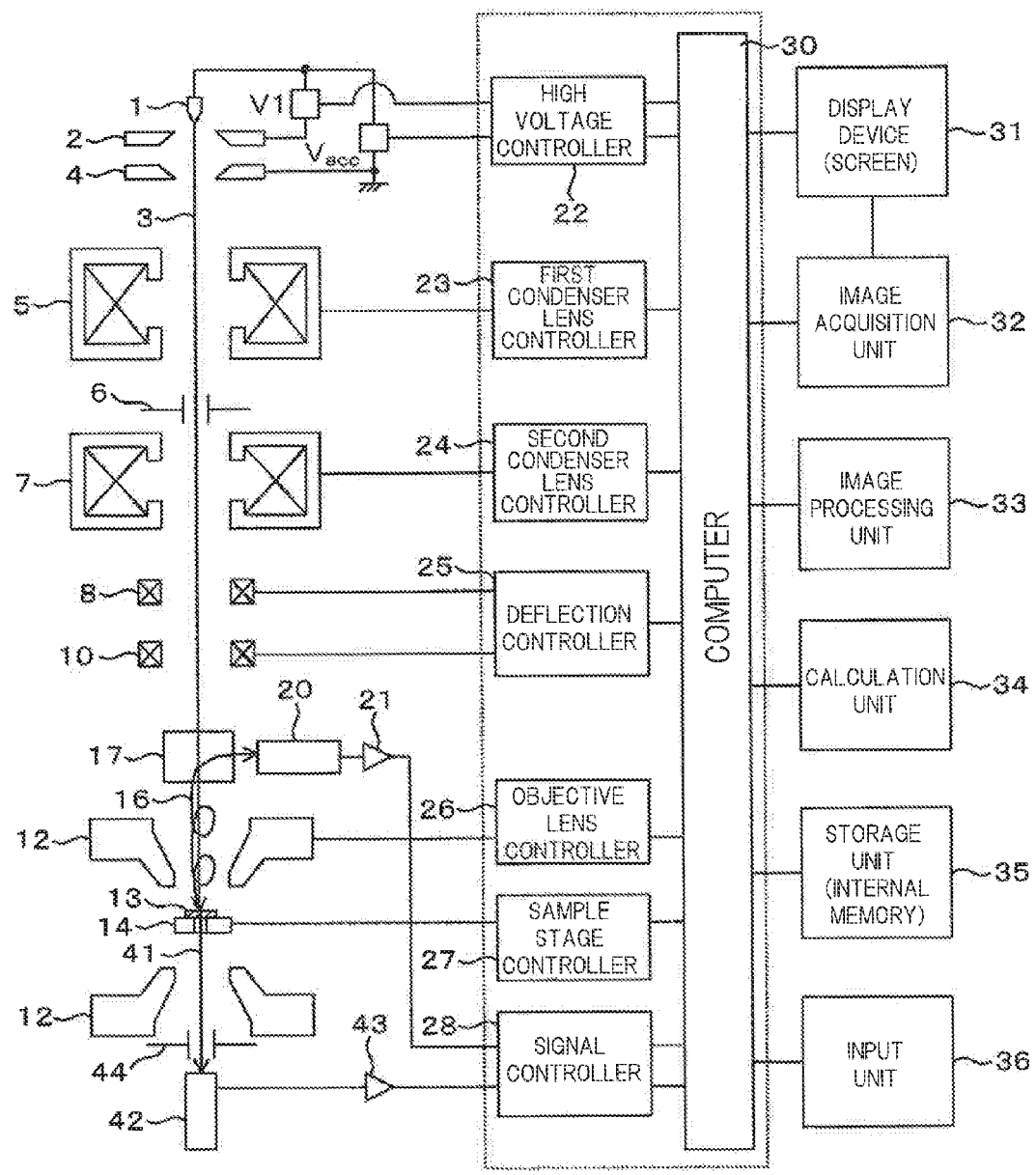
FIG. 1 is a schematic view of an embodiment of the present invention.

FIG. 1 is a schematic view showing a scanning electron microscope according to an embodiment of the present invention. Note that a scanning electron microscope in this embodiment is a scanning electron microscope having means for detecting scanning transmission electrons, and is sometimes referred to as a scanning transmission electron microscope.

A primary electron beam 3 emitted from a cathode 1 by a voltage V1 applied to the cathode 1 and a first anode 2 is accelerated by a voltage $V_{acc}$ applied to a second anode 4 and propagates to an electromagnetic lens system on a subsequent stage. In this case, a high voltage controller 22 controls the accelerating voltage $V_{acc}$ and the voltage V1. The primary electron beam 3 is condensed by a first condenser lens 5 controlled by a first condenser lens controller 23. Further, after an unnecessary region is removed from the primary electron beam 3 by an objective aperture 6, the primary electron beam 3 is condensed again by a second condenser lens 7 controlled by a second condenser lens controller 24, focused by an objective lens 12 controlled by an objective lens controller 26 on a sample 13, and two-dimensionally scans the sample 13 by an upper deflection coil 8 and a lower deflection coil 10 to which a deflection controller 25 is connected. The sample 13 needs to be a thin film in order to acquire scanning transmission electrons. In addition, the sample 13 needs to be the one whose crystal lattice spacing is known, in order to be used for dimensional calibration. The sample 13 is placed on a sample stage 14 controlled by a sample stage controller 27.

Of the signals generated from the primary electron beam irradiation point on the sample 13, a secondary electron 16 having information of the sample surface is taken up by the magnetic field of the objective lens 12, separated from the primary electron beam 3 by an orthogonal electric and magnetic field (EXB) device 17 disposed above the objective lens 12, detected by a detector 20 and then amplified by an amplifier 21. Also, a scanning transmission electron 41 obtained when the primary electron beam 3 is transmitted through the sample 13 is detected by a detector 42 disposed below the sample 13 and amplified by an amplifier 43. Note that the scanning transmission electron 41 includes an elastically scattered electron and an inelastically scattered electron described later. At this time, the detection angle of the scanning transmission electron 41 is limited by an aperture 44 disposed between the objective lens 12 and the detector 42. The amplifier 21 and the amplifier 43 are controlled by a signal controller 28. The respective controllers 22 to 28 are controlled by a computer 30 which controls the overall instrument. The signals of amplified secondary electrons and transmission electrons are displayed as an enlarged image of the sample on the screen of a display device 31. Other units connected to the computer 30 include an image acquisition unit 32 which acquires the observation image displayed on the display device 31 as image information, an image processing unit 33 which performs various types of image processing for the observation image, a calculation unit 34 which calculates parameters from the result of this image processing and performs various types of calculations, a storage unit 35 such as an internal memory which stores the observation images and calculation results, and an input unit 36 which inputs observation conditions and the like. The image acquisition unit 32 can directly acquire the captured image without interposing the display device 31. Note that the image acquisition unit 32, the image processing unit 33, the calculation unit 34, and the storage unit 35 may be implemented as functions of the computer 30 or may be implemented by programs executed by the computer 30. In addition, the image processing unit 33 may function also as the calculation unit 34 and vice versa. In addition, if the display device 31 is a touch panel, the input unit 36 may serve also as the screen displayed on the display device 31.

Figure 2:
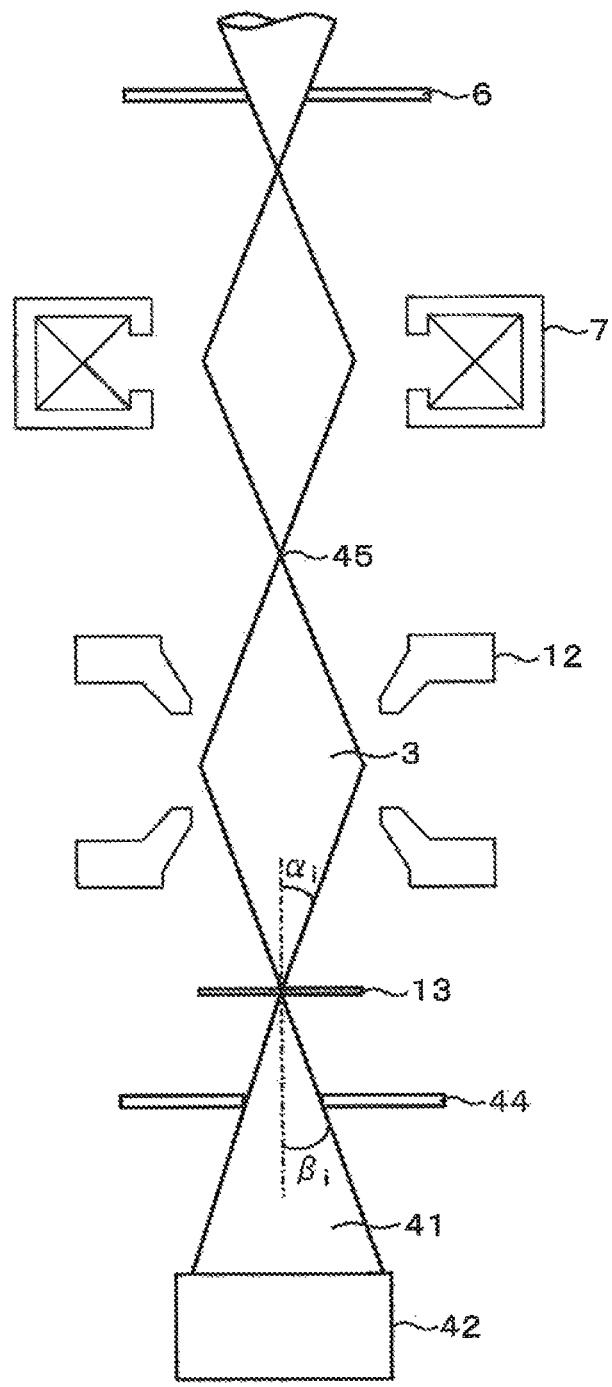
FIG. 2 is an explanatory diagram of a beam convergence semi-angle $\alpha_i$ and a detection angle $\beta_i$.

FIG. 2 is an explanatory diagram of a beam convergence semi-angle $\alpha_i$ relative to the primary electron beam 3 and a detection angle $\beta_i$ relative to the scanning transmission electron 41. The beam convergence semi-angle $\alpha_1$ corresponds to the spread of the primary electron beam 3 incident on the sample 13, which is represented by a semi-angle. The beam convergence semi-angle $\alpha_i$ is set by the diameter of the objective aperture 6 and a change in a crossover position 45 of the primary electron beam by the second condenser lens 7. The detection angle $\beta_i$ is a visual angle from an irradiation point of the primary electron beam on the sample 13 to the detection surface of the detector 42. The detection angle $\beta_i$ is set by changing the diameter of the aperture 44.

In general, when observing a stereoscopic image of the sample 13, the beam irradiation convergence semi-angle (hereinafter, referred to as the beam convergence semi-angle) $\alpha_i$ onto the sample is adjusted so as to minimize the primary electron beam diameter. This is because the contrast of the obtained image is optimized in this case. This condition is referred to as a normal high-resolution observation condition.

Figure 3:
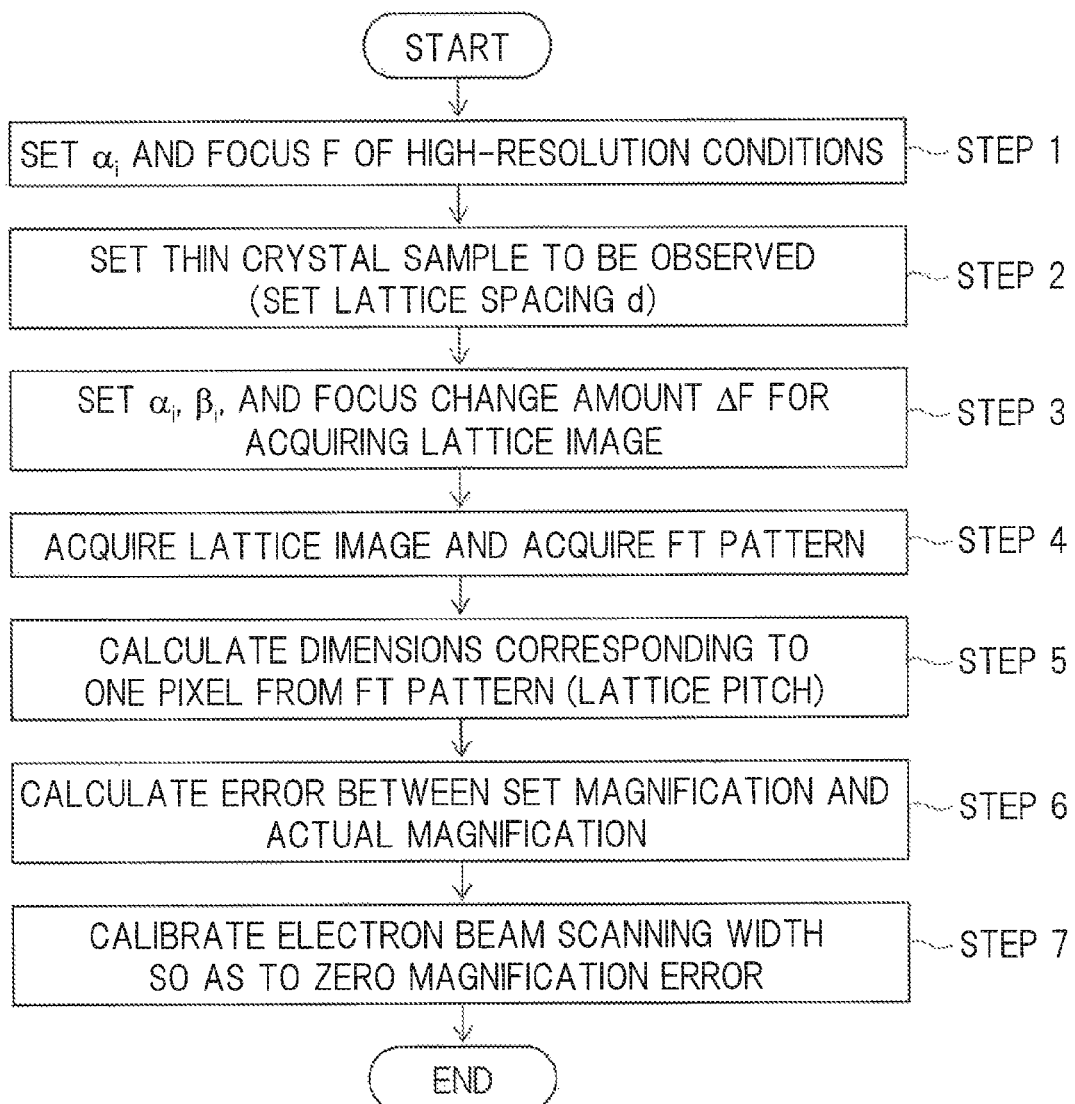
FIG. 3 is a flowchart showing processing steps in this embodiment.

The details of processing in this embodiment will be described with reference to FIG. 3.

<Step 1>

In this processing, the convergence semi-angle $\alpha_i$ of the primary electron beam 3 and a focus F are set so that the normal high-resolution observation conditions are achieved in the scanning electron microscope. The condition setting in this step may be made in accordance with an instruction from the input unit 36 or may be automatically made by a GUI like that shown in FIG. 4 described later. This allows the user to observe a high-resolution secondary electron image or scanning transmission electron image on the display device 31. In this case, the beam convergence semi-angle $\alpha_i$ is given by the value at which the spherical aberration and chromatic aberration of the objective lens 12 which are determined by the focus position of the primary electron beam 3 and the diffraction phenomenon determined by the accelerating voltage $V_{acc}$ are minimum, and the focus F is set by the relationship between the distance between the objective lens 12 and the sample (Working Distance: WD) and the excitation of the objective lens 12.

Note that the execution order of the STEP 1 and any other step in this embodiment is interchangeable, and the STEP 1 may not always be executed.

<Step 2>

Figure 4:
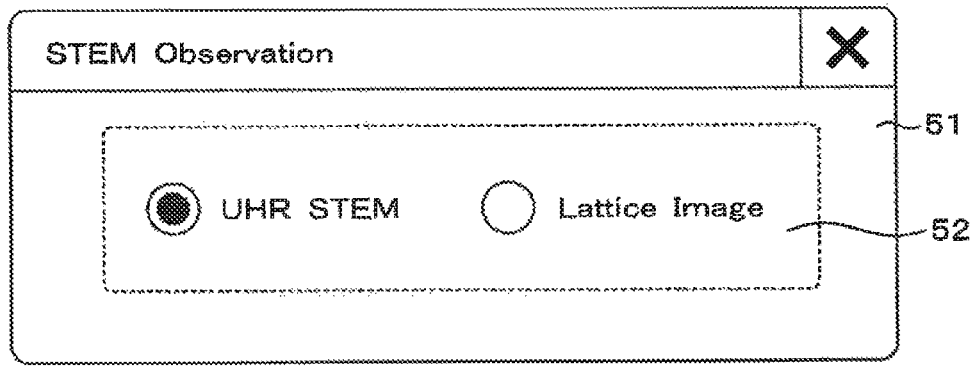
FIGS. 4a and 4b are views showing an example of a setting screen.
Figure 4:
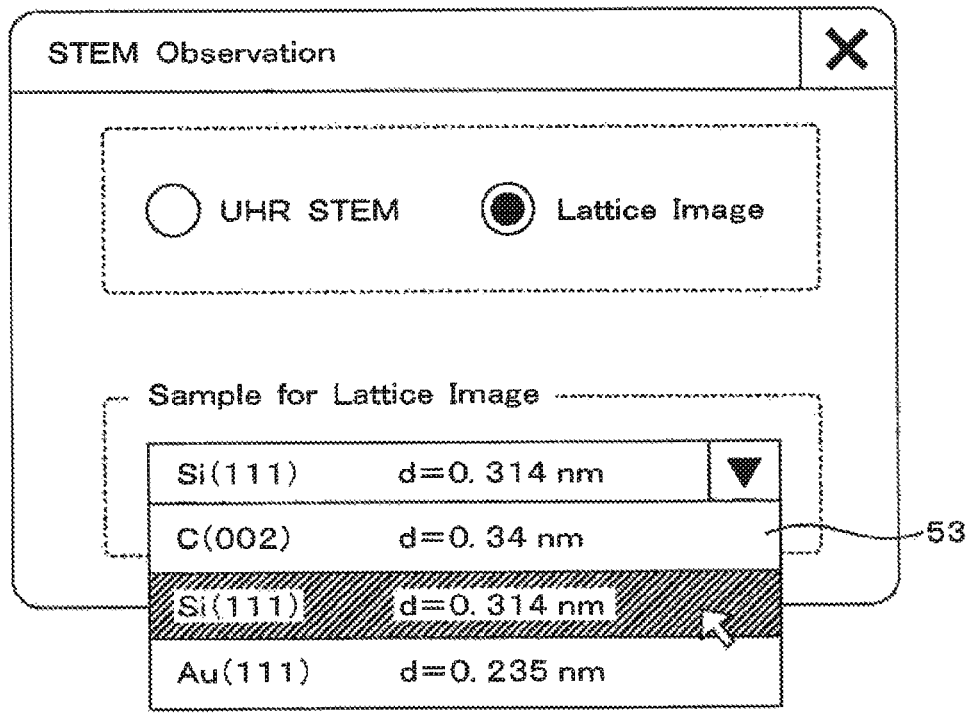

In this processing, a lattice spacing d of a thin crystal sample to be observed is set. The value of d is a known value from respective crystal samples, and for example, the (111) crystal plane spacing of silicon (Si) is 0.314 nm. FIG. 4 shows an example of a method of setting the lattice spacing d. In this case, a GUI 51 capable of selecting the type of the scanning transmission image is displayed on the display device 31. The user can select high-resolution scanning transmission electronic image observation "UHR STEM" and lattice image observation "Lattice Image" in an observation method selecting part 52 by using the input unit 36. FIG. 4 (a) shows the display at the time when "UHR STEM" is selected, and the conditions indicated in the STEP 1 described above are set in this case. On the other hand, FIG. 4(b) shows the display at the time when "Lattice Image" is selected, and a thin crystal sample list 53 of observation targets for scanning transmission images is additionally displayed. The user selects a currently observed thin crystal sample from the thin crystal sample list 53. When a sample is selected, conditions corresponding to the selected sample are set in the STEP 3 and the subsequent steps.

<Step 3>

In this processing, in order to acquire a lattice image having the lattice spacing d of the sample determined in the STEP 2, the optimal beam convergence semi-angle $\alpha_i$, the detection angle $\beta_i$ of transmission electrons, and a focus change amount $\Delta F$ from the focus F set in the sample observation in the STEP 1 are set. The lattice image mentioned here is the image obtained by the contrast (phase contrast) obtained by interference of electrons which have been transmitted through the thin sample.

Here, a method of determining $\alpha_i$ and $\beta_i$ will be described with reference to FIGS. 5 to 10.

Figure 5:
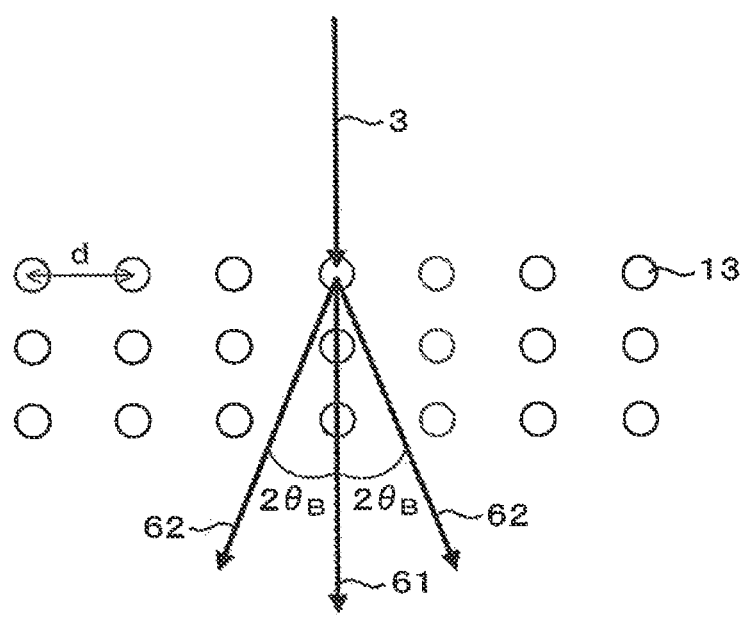
FIG. 5 is a view showing the behavior of a primary electron beam when it enters a sample.

As shown in FIG. 5, when the primary electron beam 3 enters the sample 13 having the lattice spacing d, an inelastically scattered electron 61 which is transmitted through the thin crystal sample without being scattered by the atoms of the sample and an elastically scattered electron 62 which is scattered by the atoms of the sample are transmitted through the thin crystal sample. In this case, an elastically scattered electron is scattered at an angle ($2\theta_B$) twice as large as the Bragg angle $\theta_B$ according to the Bragg's law. Here, $$\theta_B = \lambda/2d$$

is satisfied, and $\lambda$ is the wavelength of an electron and is obtained by the following equation by the use of the accelerating voltage $V_{acc}$.

$$\lambda = \sqrt{(1.5/V_{acc})} (\text{nm})$$

Figure 6:
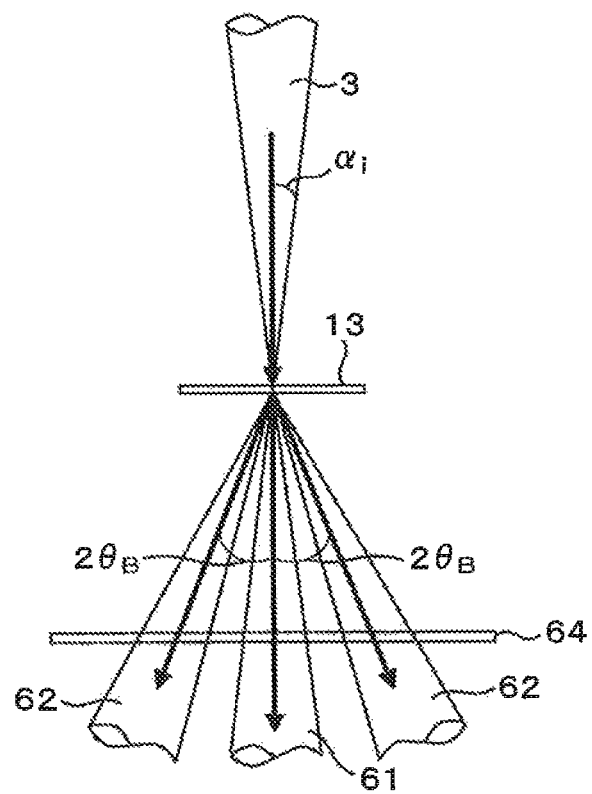
FIGS. 6a and 6b are views showing a state in which the beam convergence semi-angle $\alpha_i$ is smaller than a Bragg angle $\theta_B$ ($\alpha_i < \theta_B$)
Figure 6:
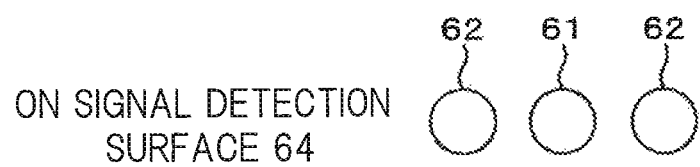
Figure 7:
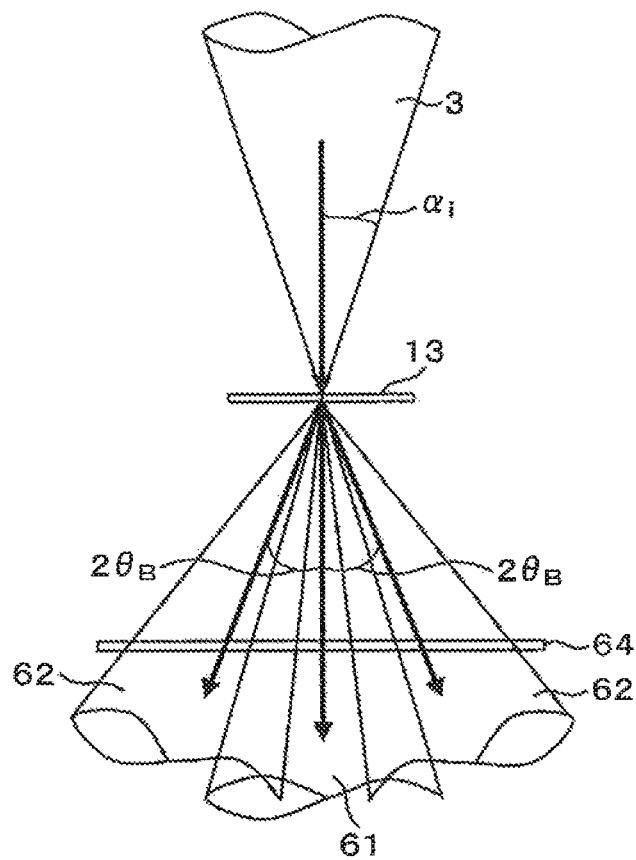
FIGS. 7a and 7b are views showing a case in which the beam convergence semi-angle $\alpha_i$ falls within the range of $\theta_B < \alpha_i \leq 2\theta_B$.
Figure 7:
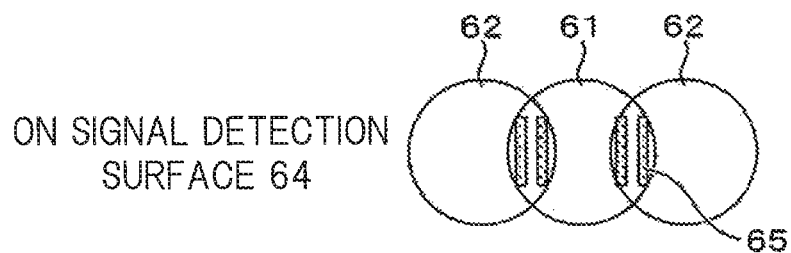
Figure 8:
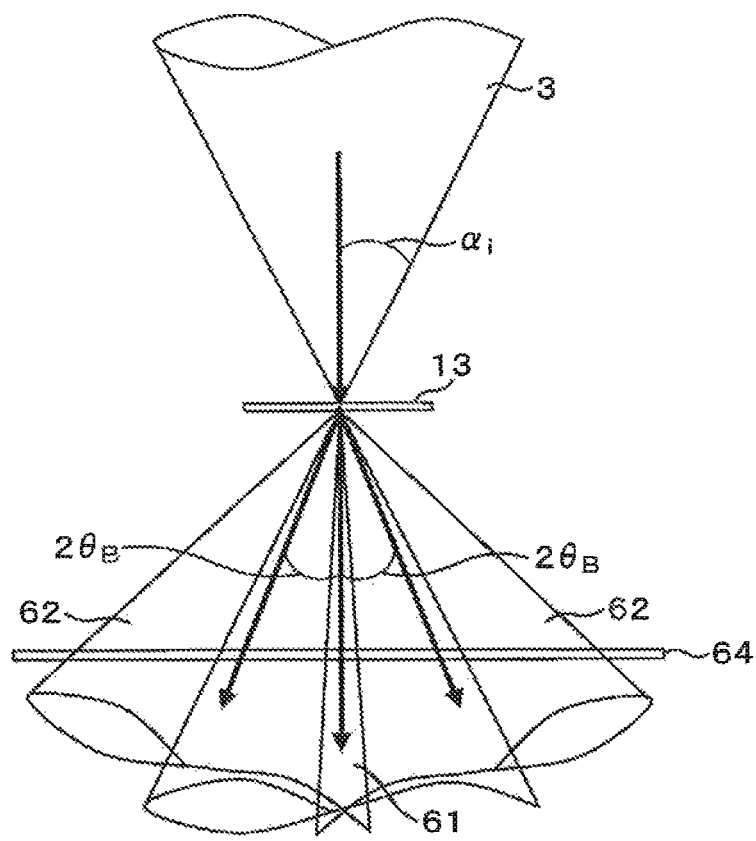
FIGS. 8a and 8b are views showing a case in which the beam convergence semi-angle $\alpha_i$ falls within the range of $2\theta_B < \alpha_i$.
Figure 8:
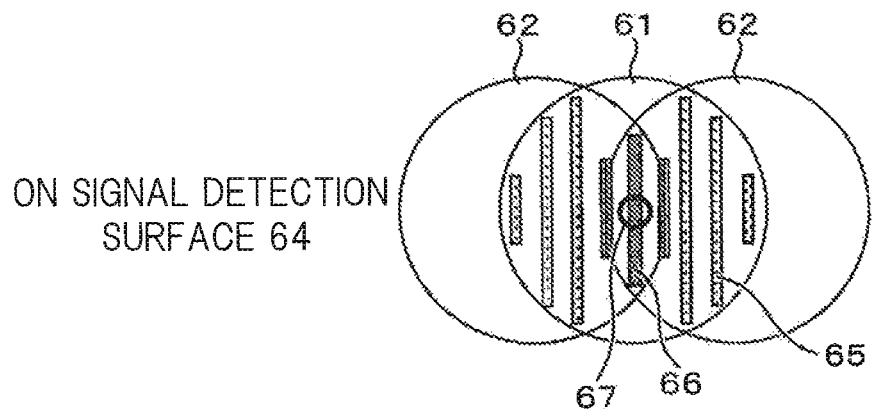
Figure 9:
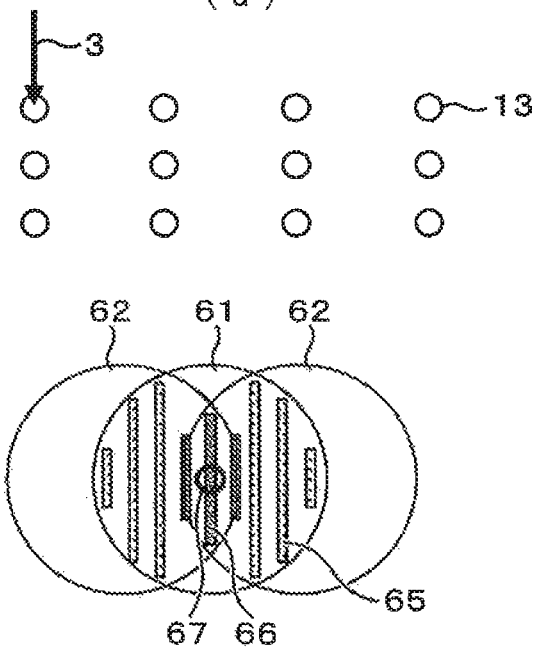
FIGS. 9a and 9b are views showing the process of obtaining a lattice image.
Figure 9:
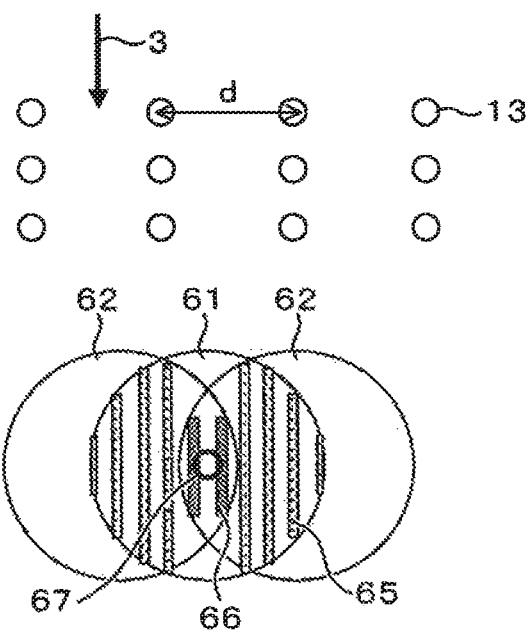

FIGS. 6 to 8 are views for describing the interference state of an electron wave in accordance with the relationship between the Bragg angle $\theta_B$ and the beam convergence semi-angle $\alpha_i$. For the sake of simplicity, FIGS. 6 to 8 each show a view at a vertical section of the sample including the optical axis. Therefore, the electron wave of an elastically scattered electron to be described below is actually scattered in a doughnut form at a predetermined scattering angle.

Under the conditions of the STEP 1, the state is as shown in FIG. 6(a), and the beam convergence semi-angle $\alpha_i$ becomes smaller than the Bragg angle $\theta_B$ ($\alpha_i < \theta_B$). At this time, the inelastically scattered electron 61 does not overlap the elastically scattered electron 62. Therefore, a signal form like that shown in FIG. 6(b) appears on a signal detection surface 64. Note that the signal detection surface 64 is the detection surface of the detector 42.

Next, the case in which $\alpha_i$ is enlarged from the state shown in FIG. 6(a) (conditions of the STEP 1) and falls within the range of $\theta_B < \alpha_i \leq 2\theta_B$ as shown in FIG. 7(a) will be described. At this time, since two electron waves, i.e., one elastically scattered electron 62 and the inelastically scattered electron 61 overlap each other, an interference pattern 65 of the electron waves appears in a region in which the two waves overlap on the signal detection surface 64 as shown in FIG. 7(b).

Moreover, the case in which $\alpha_i$ is further enlarged from the state shown in FIG. 7(a) and falls within the range of $\alpha_i > 2\theta_B$ as shown in FIG. 8 (a) will be described. At this time, three electron waves, i.e., both elastically scattered electrons and the inelastically scattered electron overlap each other, and an interference pattern 66 appears in the middle of the inelastically scattered electron on the signal detection surface 64 as shown in FIG. 8 (b). The interference pattern formed in the middle is detected as a scanning transmission electron signal in a (signal) detecting area 67 of the detection angle $\beta_i$ formed by the aperture 44 as shown in FIG. 9(a). Furthermore, by scanning the sample 13 with the primary electron beam 3, the interference patterns 65 and 66 shift as shown in FIG. 9(b).

Figure 10:
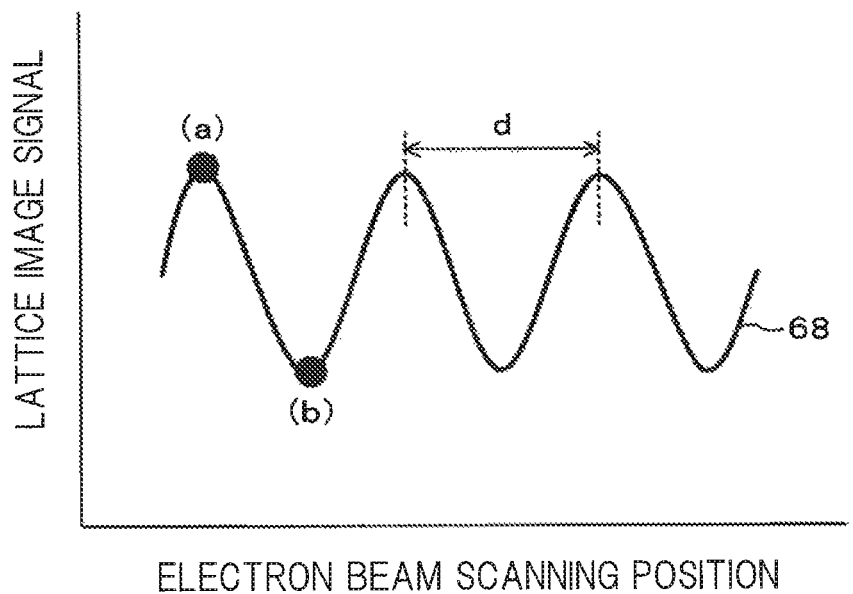
FIG. 10 is a graph showing the change in a lattice image signal with respect to the electron beam scanning position.

FIG. 10 is a graph in which the abscissa represents a scanning position on the sample 13 and the ordinate represents the total amount of scanning transmission electrons detected in the range of the detection angle $\beta_i$. By scanning the sample 13 with the primary electron beam 3, the interference patterns 65 and 66 shift, and a lattice image signal 68 having high and low intensities appears in the scanning transmission electron image as shown in FIG. 10. The intensity change of the lattice image signal 68 is detected by the detector 42 and amplified by the amplifier 43, and is then output as a lattice image to the display device 31 through the signal controller 28 and the computer 30.

Figure 11:
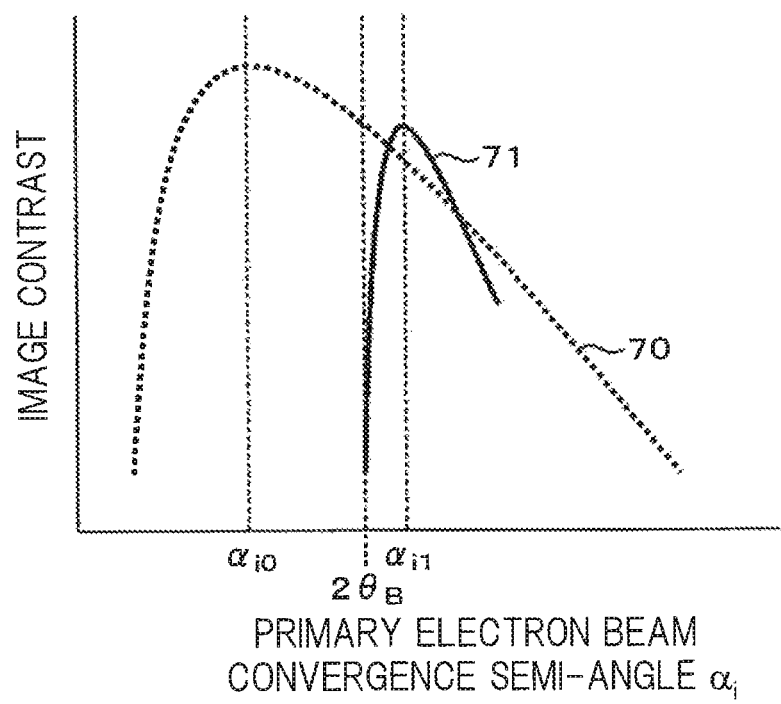
FIG. 11 is a graph showing the change in image contrast with respect to the primary electron beam convergence semi-angle.

As described above, at least $\alpha_i$ needs to be set to an angle larger than $2\theta_B$, but in order to observe a lattice image at an accelerating voltage of 30 kV or less, it is necessary to set a more appropriate beam convergence semi-angle (to be represented as $\alpha_{i1}$). This will be described with reference to FIG. 11. FIG. 11 shows the relationship between beam convergence semi-angle and image contrast at a predetermined lattice spacing d and a predetermined accelerating voltage $V_{acc}$.

In a normal secondary electron image or scanning transmission image, the beam diameter is minimized at the beam convergence semi-angle (represented as $\alpha_{i0}$) in the STEP 1 and the image contrast is maximized thereat as indicated by a secondary electron/scanning transmission image contrast 70. In the scanning transmission electron microscope with an accelerating voltage of 100 kV or more, since $2\theta_B$ is smaller than the beam convergence semi-angle $\alpha_{i0}$ at the minimum beam diameter, a lattice image is visualized under the condition that maximizes the contrast of the scanning transmission image (the beam convergence semi-angle $\alpha_{i\theta}$ at the minimum beam diameter). Therefore, it is not necessary to strictly adjust the beam convergence semi-angle $\alpha_i$ in accordance with the lattice spacing. In contrast, in a general-purpose scanning electron microscope with a maximum accelerating voltage of 30 kV or less, since the beam convergence semi-angle $\alpha_{i\theta}$ corresponding to a condition that minimizes the beam diameter is smaller than $2\theta_B$, it is not possible to obtain a lattice image under the condition of the beam convergence semi-angle $\alpha_{i\theta}$.

As described above, when the beam convergence semi-angle $\alpha_i$ is further increased from $\alpha_{i\theta}$ for the observation of a lattice image, the image contrast decreases in conjunction with an increase in the diameter of the primary electron beam due to the aberration of the objective lens 12. In addition, as described above, no lattice image appears unless the beam convergence semi-angle $\alpha_i$ is larger than $2\theta_B$.

When the beam convergence semi-angle is further increased to satisfy $\alpha_i > 2\theta_B$, a lattice image is obtained. In this case, in the scanning electron microscope with an accelerating voltage of 30 kV or less, since the beam diameter is increased, the optimal range of the beam convergence semi-angle $\alpha_i$ to be set is very limited with respect to the lattice spacing d and accelerating voltage as compared with the scanning transmission electron microscope with the accelerating voltage of 100 kV to 200 kV as shown in FIG. 11. Therefore, when executing the dimensional calibration using a thin crystal sample in a scanning electron microscope with an accelerating voltage of 30 kV or less, it is desirable to set optimal conditions for stably acquiring a lattice image. The lattice image contrast is maximized at a beam convergence semi-angle $\alpha_{i1}$ like a lattice image contrast 71 in FIG. 11 with respect to a beam convergence semi-angle ($\alpha_i > 2\theta_B$) at which the lattice image can be observed. Therefore, for the observation of a lattice image, the beam convergence semi-angle is set to $\alpha_{i1}$, and $\alpha_{i1}$ is defined by the following equation.

$$\alpha_{i1} = 2\theta_B + \Delta\alpha_i$$

$\theta_B$ is determined by the above equation, and $\Delta\alpha_i$ and the detection angle $\beta_i$ are determined based on experimental results acquired in advance. $\Delta\alpha_i$ is an amount dependent on the lattice spacing d, the accelerating voltage $V_{acc}$, the detection angle $\beta_i$, and the working distance (WD) of the objective lens. Here, the lattice spacing d and the accelerating voltage $V_{acc}$ are determined from inputs of the user in FIG. 4, and the detection angle $\beta_i$ and the working distance (WD) are determined from the state of the instrument when acquiring a lattice image. Therefore, if the optimal $\Delta\alpha_i$ is obtained with respect to the lattice spacing d, the accelerating voltage $V_{acc}$, the detection angle $\beta_i$, and the working distance (WD) of the objective lens and stored in the storage unit 35 in advance, it is possible to read out and set the optimal $\Delta\alpha_i$ when acquiring a lattice image.

Next, the setting of a focus change amount $\Delta F$ will be described. A focus F' for the observation of a lattice image changes depending on the lattice spacing d of the thin crystal sample to be observed with respect to the focus F under the normal high-resolution observation conditions set in the STEP 1. Therefore, since there is a difference between the focuses F and F', the focus setting needs to be shifted by the amount given by $\Delta F = F - F'$. Here, in the case of a scanning transmission electron microscope with an accelerating voltage of 100 kV or more, since a beam convergence semi-angle $\alpha_i'$ at the time of the observation of a lattice image is not large, the shift of the focus change $\Delta F$ does not lead to a large image change. Therefore, a lattice image is normally observed without giving the focus change $\Delta F$. However, in the case of a scanning electron microscope with an accelerating voltage of 30 kV or less, in order to observe a lattice image, $\alpha_i$ needs to be increased as described above, and hence the shift of the focus change $\Delta F$ leads to a large image change. Therefore, when observing a lattice image at 30 kV or less, focus adjustment is required. Although the user may adjust the focus in each case, since proficiency is required to achieve an optimal focus setting, it is necessary that an optimal focus condition F' (or the change $\Delta F$ from the focus condition F) for the observation of a lattice image is set in accordance with the lattice spacing d of the sample on the instrument side. Since the focus condition F' is given by a function of the Bragg angle $\theta_B$, it is determined by using the accelerating voltage and the lattice spacing d as indicated by the equation above.

In addition, an optimal value is present also for the detection angle $\beta$. As described with reference to FIG. 2, since the detection angle $\beta$ is determined by the diameter of the aperture 44, it is possible to select an optimal value of $\beta$ by adjusting the diameter. For example, the diameter of the aperture 44 is preferably made variable so as to be able to switch the diameter stepwise or continuously. Alternatively, the aperture 44 itself may be replaced with another aperture having a different diameter. Lattice images are acquired at the beam convergence semi-angle $\alpha_{i1}$ and the focus condition F' with respect to a plurality of diameters, i.e., a plurality of detection angles, and the conditions that can acquire the sharpest lattice image are selected in advance.

Note that, since the optimal ranges of the optimal detection angle $\beta_i$ and the defocus amount $\Delta F$ are also very limited like the relationship of the contrast to the beam convergence semi-angle $\alpha_i$ shown in FIG. 11, it is preferable to obtain the optimal detection angle $\beta_i$ and the optimal defocus amount $\Delta F$ for the acquisition of a lattice image and store them in the storage unit 35 in advance like the case described above. At this time, the optimal beam convergence semi-angle $\alpha_{i1}$ (or optimal $\Delta\alpha_i$), the optimal detection angle $\beta_i$, and the optical focus condition F' (or optimal $\Delta F$) are preferably stored as a set in advance. The information concerning the beam convergence semi-angle $\alpha_i$, the detection angle $\beta_i$, and the focus change amount $\Delta F$ from the focus F for the observation of a lattice image which are determined in the above-described manner is stored in the storage unit 35 for each thin crystal sample in advance, is read in accordance with the thin crystal sample (or the lattice spacing d) set in the STEP 2, and is set through the calculation unit 34 and the computer 30.

<Step 4>

The lattice image obtained under the conditions set in the STEP 3 is acquired by the image acquisition unit 32. This lattice image may be displayed on the display device 31. In addition, a Fourier transform (FT) for the acquired lattice image is performed by the image processing unit 33 to acquire a Fourier transform pattern (FT information). In this manner, it is possible to check whether the desired lattice spacing d has been obtained. If the desired lattice spacing d has been obtained, it can be determined that the magnification calibration to be described below is unnecessary. If the desired lattice spacing d has not been obtained, a corresponding warning message can be displayed on a GUI, thereby improving the reliability of the measurement.

<Step 5>

Dimensions corresponding to one pixel of an image is calculated from the FT information of the lattice image obtained in the STEP 4 by the calculation unit 34, and an actual magnification value M' of the lattice image obtained in the STEP 4 is calculated based on the calculation result.

<Step 6>

An error ratio ∈ between a magnification value M set by the computer 30 in the STEP 4 and the actual magnification M' is calculated from the result of the STEP 5 according to the following equation.

$$\epsilon = (M - M')/M'$$

<Step 7>

The electron beam scanning width of the scanning electron microscope is calibrated by changing the current flowing in the upper deflection coil 8 and the lower deflection coil 10 by the computer through the deflection controller 25 so as to zero the magnification error ∈ obtained in the STEP 6.

As described above, according to this embodiment, it is possible to implement highly reliable dimensional calibration using a lattice image of a thin crystal sample.

In particular, since a lattice image of a thin crystal sample can be easily observed even with a scanning electron microscope with a low accelerating voltage, it is possible to perform the magnification calibration at high magnification based on the known lattice spacing d. It is therefore possible to provide a highly reliable scanning electron microscope with respect to dimensional measurement at a high magnification of 1,000,000× or more, which has been conventionally impossible.

The present invention is not limited to the foregoing embodiments and various modifications and alterations can be made within the scope of the present invention. For example, the embodiments above have been described in detail so as to make the present invention easily understood, and the present invention is not limited to the embodiment having all of the described constituent elements. Also, a part of the configuration of one embodiment may be replaced with the configuration of another embodiment, and the configuration of one embodiment may be added to the configuration of another embodiment. Furthermore, another configuration may be added to a part of the configuration of each embodiment, and a part of the configuration of each embodiment may be eliminated or replaced with another configuration.

DESCRIPTION OF REFERENCE CHARACTERS

1 . . . cathode
2 . . . first anode
3 . . . primary electron beam
4 . . . second anode
5 . . . first condenser lens
6 . . . objective aperture
7 . . . second condenser lens
8 . . . upper deflection coil
10 . . . lower deflection coil
12 . . . objective lens
13 . . . sample
14 . . . sample stage
16 . . . secondary electron
17 . . . orthogonal electric and magnetic field (EXB) device
20, 42 . . . detector
21, 43 . . . amplifier
22 . . . high voltage controller
23 . . . first condenser lens controller
24 . . . second condenser lens controller
25 . . . deflection controller
26 . . . objective lens controller
27 . . . sample stage controller
28 . . . signal controller
30 . . . computer
31 . . . display device
32 . . . image acquisition unit
33 . . . image processing unit
34 . . . calculation unit
35 . . . storage unit
36 . . . input unit
41 . . . scanning transmission electron
44 . . . aperture
45 . . . crossover position
51 . . . GUI
52 . . . observation method selecting part
53 . . . thin crystal sample list
61 . . . inelastically scattered electron
62 . . . elastically scattered electron
64 . . . signal detection surface
65, 66 . . . interference pattern
67 . . . (signal) detecting area
68 . . . lattice image signal
70 . . . secondary electron/scanning transmission electron image contrast
71 . . . lattice image contrast

The invention claimed is:

1. A scanning transmission electron microscope comprising:
an electron source which generates an electron beam;
a deflector which deflects the electron beam so as to scan a sample with the electron beam;
an objective lens which focuses the electron beam on the sample;
a detector which detects a scanning transmission electron transmitted through the sample; and
an aperture which is disposed between the sample and the detector to control a detection angle of the scanning transmission electron,
wherein the electron beam enters the sample at a predetermined convergence semi-angle, and
a lattice image is acquired at a second convergence semi-angle larger than a first convergence semi-angle at which a beam diameter is minimized on the sample.

2. The scanning transmission electron microscope according to claim 1,
wherein the second convergence semi-angle is larger than twice a Bragg angle $\theta_B$.

3. The scanning transmission electron microscope according to claim 2,
wherein the first convergence semi-angle is smaller than twice the Bragg angle $\theta_B$.

4. The scanning transmission electron microscope according to claim 1,
wherein a maximum accelerating voltage of the electron beam is 30 kV or less.

5. The scanning transmission electron microscope according to claim 1,
wherein the detector detects a signal amount originating from an interference pattern caused by interference between an elastically scattered electron and an inelastically scattered electron included in the scanning transmission electron, and includes a calculation unit which detects an intensity change of the signal amount by scanning the sample with the electron beam and obtains a crystal lattice spacing of the sample from the intensity change.

6. The scanning transmission electron microscope according to claim 1, further comprising:
a storage unit which stores the second convergence semi-angle, the detection angle, and a focus value of the objective lens for each sample as conditions for acquiring the lattice image in advance.

7. The scanning transmission electron microscope according to claim 1,
   wherein a crystal lattice spacing of the sample is obtained from the lattice image, and magnification calibration is performed based on the crystal lattice spacing.

8. The scanning transmission electron microscope according to claim 5,
   wherein a crystal lattice spacing of the sample is obtained from the lattice image, and magnification calibration is performed based on the crystal lattice spacing.

* * * * *